(12) United States Patent  
Weng et al.

(10) Patent No.: US 7,940,131 B2  
(45) Date of Patent: May 10, 2011

(54) APPARATUS, METHOD AND COMPUTER PROGRAM PRODUCT FOR TRACKING INFORMATION IN AN ELECTRIC GRID

(75) Inventors: Haiqing Weng, Shanghai (CN); John D. D'Atre, Salem, VA (US); Robert A. Seymour, Roanoke, VA (US); Allen M. Ritter, Roanoke, VA (US); Xiaoming Yuan, Shanghai (CN); Renchang Dai, Shanghai (CN); Robert W. Delmerico, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 175 days.

(21) Appl. No.: 12/196,794

(22) Filed: Aug. 22, 2008

(65) Prior Publication Data

US 2009/0015339 A1   Jan. 15, 2009

Related U.S. Application Data

(63) Continuation of application No. 11/329,248, filed on Jan. 10, 2006, now Pat. No. 7,456,695.

(51) Int. Cl.  
  *G05F 1/70* (2006.01)
(52) U.S. Cl. ............................ 331/44; 332/117; 323/205
(58) Field of Classification Search .................... 332/17; 331/44; 323/205  
See application file for complete search history.

(56) References Cited

U.S. PATENT DOCUMENTS

| | | | |
|---|---|---|---|
| 6,757,350 B1 | 6/2004 | Chesavage | |
| 6,850,426 B2 | 2/2005 | Kojori et al. | 363/123 |
| 6,853,940 B2 | 2/2005 | Tuladhar | 702/111 |
| 6,864,595 B2 | 3/2005 | Wall | 290/52 |
| 6,919,650 B2 | 7/2005 | Deng | 307/45 |
| 6,973,145 B1 | 12/2005 | Smith et al. | |
| 7,233,129 B2 | 6/2007 | Erdman et al. | |
| 7,340,012 B2 * | 3/2008 | Brown et al. | 375/320 |
| 2003/0165036 A1 | 9/2003 | Tuladhar | 361/62 |
| 2003/0218887 A1 | 11/2003 | Kojori et al. | 363/16 |
| 2003/0222507 A1 | 12/2003 | Deng | 307/87 |
| 2005/0012339 A1 | 1/2005 | Mikhail et al. | |

(Continued)

FOREIGN PATENT DOCUMENTS

EP          1561946 A2          1/2005

(Continued)

OTHER PUBLICATIONS

Search Report for Foreign Patent Application No. PA 2007 00006; Search Report dated Jun. 2, 2009.

(Continued)

*Primary Examiner* — Robert Pascal  
*Assistant Examiner* — James E Goodley  
(74) *Attorney, Agent, or Firm* — Cantor Colburn LLP

(57) ABSTRACT

An apparatus for rapidly tracking fundamental frequency information in the signal of an electric grid is a cross-coupled phase-lock loop filter (CCPLL) that includes the use of a phase-lock-loop (PLL) apparatus having a plurality individual filters, wherein an input for a first filter in the plurality of individual filters comprises the signal of the electric grid and an output signal from at least a second filter in the plurality of individual filters. A method for using the CCPLL includes applying a signal to the CCPLL and monitoring the output of the CCPLL. Use of the CCPLL may be accomplished or modeled via computer instructions stored on machine readable media.

14 Claims, 10 Drawing Sheets

U.S. PATENT DOCUMENTS

2005/0122083 A1     6/2005     Erdman et al. .................. 322/20

FOREIGN PATENT DOCUMENTS

| WO | WO 03/094334 A2 | 11/2003 |
| --- | --- | --- |
| WO | WO 03/094334 A3 | 11/2003 |
| WO | WO 03/103112 A1 | 12/2003 |

OTHER PUBLICATIONS

Vikram Kaura, et al.; Operation of a Phase Locked Loop System Under Distorted Utility Conditions; IEEE Transactions on Industry Applications, vol. 33, No. 1, Jan./Feb. 1997; pp. 58-63.

M.R. Iravani, et al.; Online estimation of steady state and instantaneous symmetrical components; IEE Proc.-Gener. Transm. Distrib., vol. 150, No. 5, Sep. 2003; pp. 616-622.

Changjiang Zhan, et al.; Software Phase-Locked Loop applied to Dynamic Voltage Restorer (DVR); 2001 IEEE; pp. 1033-1038.

Dragan Jovcic; Phase Locked Loop System for FACTS; 2003 IEEE; pp. 1116-1124.

Xiaoming Yuan, et al.; Stationary-Frame Generalized Integrators for Current Control of Active Power Filters With Zero Steady-State Error for Current Harmonics of Concern Under Unbalanced and Distroted Operating Conditions; 2002 IEEE; pp. 523-532.

Hilmy Awad, et al.; Tuning Software Phase-Locked Loop for Series-Connected Converters; 2005 IEEE; pp. 300-308.

Hong-Seok Song, et al.; Very Fast Phase Angle Estimation Algorithm for a Single-Phase System having Sudden Phase Angle Jumps; 2002 IEEE; pp. 925-931.

Chinese Office Action issued Jun. 28, 2010 with English Translation of the text.

\* cited by examiner

APPARATUS, METHOD AND COMPUTER PROGRAM PRODUCT FOR TRACKING INFORMATION IN AN ELECTRIC GRID

CROSS REFERENCE TO RELATED APPLICATION

This application is a continuation application of U.S. Ser. No. 11/329,248, filed Jan. 10, 2006, the contents of which are incorporated by reference herein in their entirety.

BACKGROUND OF THE INVENTION

The teachings herein relate generally to techniques for rapid detection of phase and amplitude information in an electrical signal.

Present state of the art assumes a steady voltage and a steady frequency as important references for the orientation of responses. Often a single set of frequencies and amplitudes are insufficient to describe the true nature of the signal, and severely limit the responses of the system. Furthermore, if other knowable frequencies and magnitudes are not eliminated from the response, then substantial control effort is misdirected.

In the case of power converters, the present state of the art uses phase-lock loop circuits to identify single frequencies and single magnitudes. This approach without the present invention does not remove the unwanted amplitude and frequency responses, and cannot be directed singularly to the desired response.

In the case of highly-reliable, cost-sensitive power conversion equipment, as might be used in wind turbines, the present invention directs more of the control effort to the useful response of the power-limited elements.

Many countries now require that electric power generation facilities stay connected with the electric grid when the grid is faulted. Additional requirements include the ability to control real and reactive power flow during a voltage depression created by a grid fault, and the ability to recover quickly following fault clearing. The ability of the generator to meet these requirements is heavily dependent on the design of the converter control system to track the phase and amplitude information of the sequence components at the point of connection with the grid. Accurate and rapid tracking capability is necessary for the control systems to make timely adjustments to the converter thereby mitigating the effect of any large signal transients created by grid faults or other grid disturbances.

Detection of the fundamental frequency phase and amplitude information during grid faults is difficult because of the distorted and unbalanced components in the measured grid signals. Previous efforts to address the distorted and unbalanced components are too slow and limit the performance of the control system. Such is the case for conventional phase-lock-loop (PLL) design. Efforts involving conventional PLL have typically been designed with relatively slow response in order to accommodate the distorted and unbalanced input voltage. Thus, even under a symmetrical fault, the response of PLL systems is not as rapid as desired. Accordingly, the need for rapid detection of system information presents a critical challenge to PLL design.

This invention will describe a technique for rapidly detecting the desired components of a distorted and unbalanced signal having a plurality of sequence components of different frequencies.

BRIEF DESCRIPTION OF THE INVENTION

The above discussed and other drawbacks and deficiencies are overcome or alleviated by the teachings disclosed herein.

Disclosed is a cross-coupled phase-lock-loop filter (CCPLL) for tracking a signal of an electric grid, the CCPLL that includes a plurality of PLL filters, wherein an input for a first PLL filter in the plurality of PLL filters includes the signal of the electric grid and an output signal from at least a second PLL filter in the plurality of PLL filters.

Also disclosed is a method for tracking a signal of an electric grid, which includes selecting a cross-coupled phase-lock-loop filter (CCPLL) comprising a plurality of PLL filters, wherein an input for a first PLL filter in the plurality of PLL filters includes the signal of the electric grid and an output signal from at least a second PLL filter in the plurality of PLL filters; applying the signal of the electric grid to the CCPLL, the CCPLL producing an output signal; and, monitoring the output signal of the CCPLL to track the signal of the electric grid.

Further disclosed is a computer program product stored on machine readable media including instructions which has the technical effect of providing for tracking a signal of an electric grid, wherein the instructions include selecting a cross-coupled phase-lock-loop filter (CCPLL) having a plurality of PLL filters, wherein an input for a first PLL filter in the plurality of PLL filters includes the signal of the electric grid and an output signal from at least a second PLL filter in the plurality of PLL filters; applying the signal of the electric grid to the CCPLL, the CCPLL producing an output signal; and, monitoring the output signal of the CCPLL to track the signal of the electric grid.

Also disclosed is an apparatus for tracking a signal of an electric grid and protecting equipment coupled thereto, the apparatus including a cross-coupled phase-lock-loop filter (CCPLL) for producing filtered signal information, the CCPLL including a positive sequence filter and a negative sequence filter, wherein an input for the positive sequence filter includes the signal of the electric grid and an output signal from the negative sequence filter and an input for the negative sequence filter includes the signal of the electric grid and an output signal from the positive sequence filter; and a control system coupled to the CCPLL to receive the filtered signal information and providing a protection signal to a control system of the equipment for protection thereof.

The features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures, wherein.

DETAILED DESCRIPTION THE INVENTION

Figure 1:
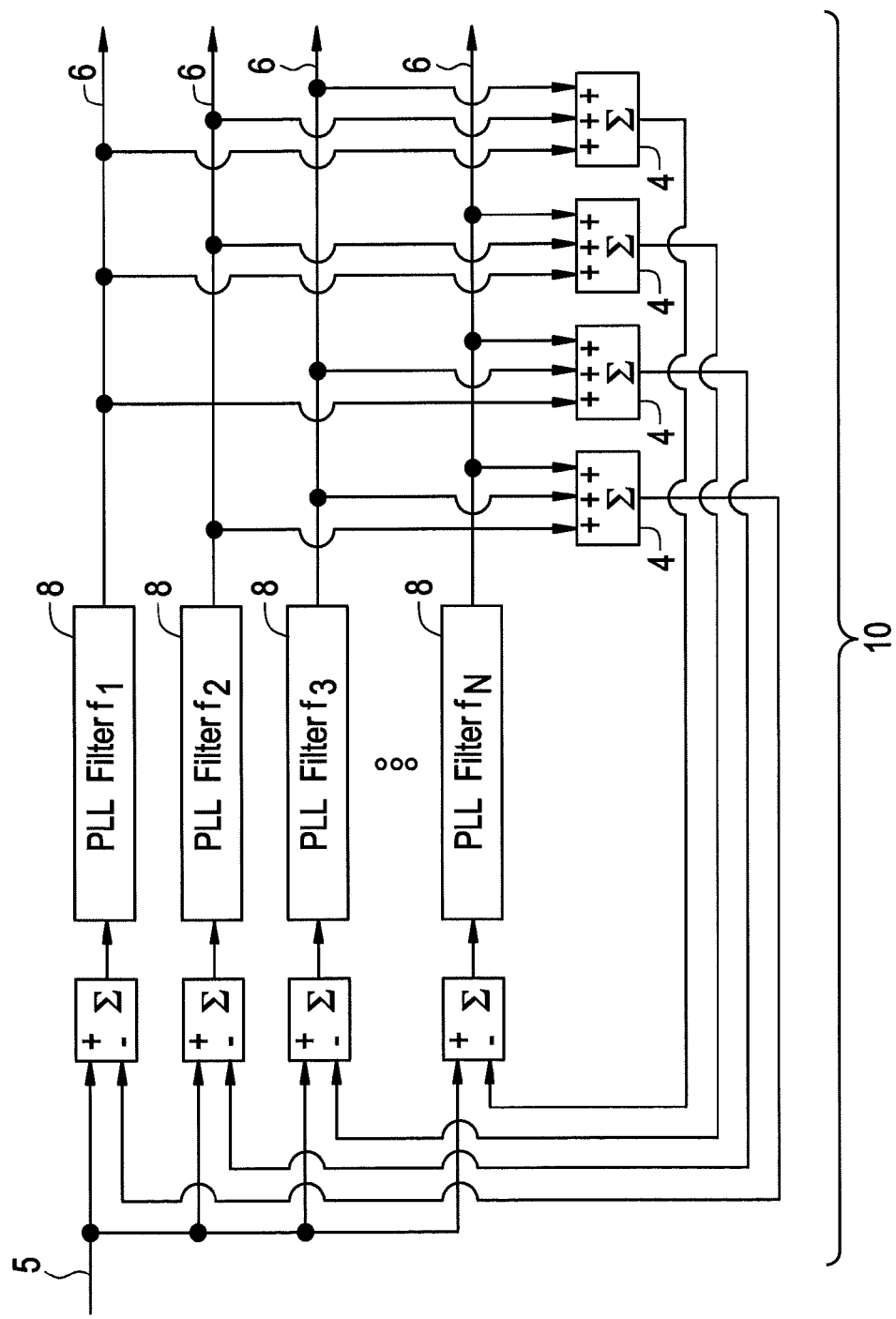
FIG. 1 is a schematic diagram illustrating aspects of a cross-coupled PLL filter (CCPLL) employing PLL filters.

Referring to FIG. 1, there is shown an exemplary architecture for a Cross-Coupled Phase-Lock-Loop (PLL) filter 10, also referred to herein as a CCPLL 10. The CCPLL 10 includes a plurality of PLL filters 8, wherein the plurality of PLL filters 8 provide for filtering each of the selected frequency components ($f_1$, $f_2$, $f_3$, . . . $f_n$) contained within the input signal 5. FIG. 1 depicts a plurality of cross-coupling circuits 4 wherein each of the PLL filter outputs 6 is cross-coupled to the each of the other PLL filter input signal 5 in the CCPLL 10.

As the design of synchronous-frame PLL circuits for use with three-phase signals is known to those skilled in the art, discussion of aspects of a synchronous-frame PLL is generally omitted herein. Further, and for simplicity, the appended drawings illustrate salient aspects of the circuits referred to herein, while omitting reference to many aspects of a synchronous-frame PLL circuit. For example, aspects such as the phase and polarity of the input signal 5 and an output signal may be denoted, while other aspects (such as physical design) are generally omitted. One skilled in the art will also recognize that the PLL architectures and embodiments disclosed herein, or developed in accordance with the teachings herein may be implemented by use of computer software. Accordingly, the various drawings provided should be construed as merely illustrative of aspects of the teachings herein, and not limiting of any specific embodiment.

By making use of the cross-coupling circuits 4 for each of the PLL filters 8, the output from each of the remaining PLL filters 8 is subtracted from the input for a given PLL filter 8. Consider, for example, the PLL filter $f_1$ depicted in FIG. 1. FIG. 1 shows that the outputs for PLL filters $f_2$, $f_3$ through $f_n$ are coupled to the negative side input of the PLL filter $f_1$.

In this way, at steady state, the input of each PLL filter 8 excludes the selected frequency components of the input signal 5, which are canceled by the cross-coupling circuit(s) 4 associated with the plurality of other PLL filters 8. Accordingly, each PLL filter 8 only detects frequency components that are not canceled. In some embodiments, each of the PLL filters 8 are cross-coupled within the plurality of PLL filters 8 making up the CCPLL 10. In other embodiments, only certain PLL filters are cross-coupled within the plurality of PLL filters 8 making up the CCPLL 10.

As used herein, the terms "transient" and "transient event" generally refer to any disturbance causing perturbations in the input signal 5. Examples of transient events that may cause a disturbance in the input signal 5 (e.g., a fault on an electric grid) are well known and not discussed further herein. In general and as discussed herein, the input signal 5 is considered to include a three-phase input signal 5 that includes at least one sequence component having a particular frequency. Inevitably, as a variety of generating facilities contribute to the input signal 5 and as a variety of phenomena including transient events may occur, the sequence components of the input signal 5 may degrade or vary to some extent. For example, the sequence components may develop harmonic frequencies or shift phase, either of which can complicate efficient operation of control systems and other aspects of grid performance. In general and as used herein, it is considered that the three-phase input signal 5 includes positive sequence components, negative sequence components and neutral sequence components. However, it should be recognized that discussion of a three-phase input signal 5 is for convenience and illustration purposes only, and not limiting of the teachings herein. For example, the teachings herein may be applied to other single-phase, multi-phase or polyphase input signals 5.

Figure 2:
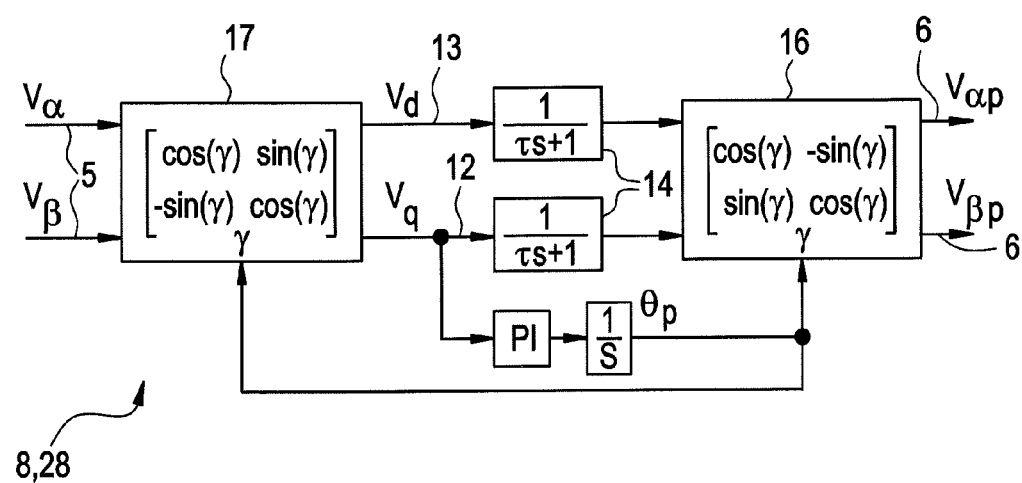
FIG. 2 depicts aspects of a PLL filter for a three-phase application.

The CCPLL 10 permits use of various embodiments of PLL filters 8, a non-limiting example of which is provided in FIG. 2.

FIG. 2 depicts aspects of a first embodiment of a PLL filter 8. The PLL filter 8 depicted is suitable for use with a three-phase input signal 5 and may be configured for use as either a positive sequence filter or a negative sequence filter. As depicted in FIG. 2, the three-phase input signal 5 is described by two signals presented in a quadrature reference frame applied at the input of the PLL filter 8.

Note that the three-phase PLL filter 28 as depicted in FIG. 2 illustrates but one embodiment for a PLL filter 8.

As used herein, the terms "positive sequence filter" and "negative sequence filter" make reference to PLL filters 8 designated for receipt and monitoring of positive sequence components and negative sequence components of the input signal 5, respectively. Again, this convention is merely illustrative of the teachings herein. That is, use of "positive sequence filters" and "negative sequence filters" are non-limiting examples of the use of PLL filters 8 for evaluation of the signal traveling on an electric grid. The positive sequence filter and the negative sequence filter each generate positive sequence information and negative sequence information, respectively. Such information as may be extracted, or substantially extracted, from the input signal include at least one of the positive sequence frequency and positive sequence magnitude; and, the negative sequence frequency and the negative sequence magnitude.

In typical embodiments involving three-phase applications, the three-phase PLL filter 28 is a conventional synchronous frame PLL circuit with a d-axis component 13 and a q-axis component 12 derived from a forward transformation block 17, each component separately passing through a signal filter. Typically, as in this case, a low pass filter 14 is used as the signal filter. The d-axis component 13 and the q-axis component 12 of the input signal 5 then pass through a reverse transformation block 16 to obtain the respective sequence component of the input signal 5 for the respective three-phase PLL filter 28.

Figure 3:
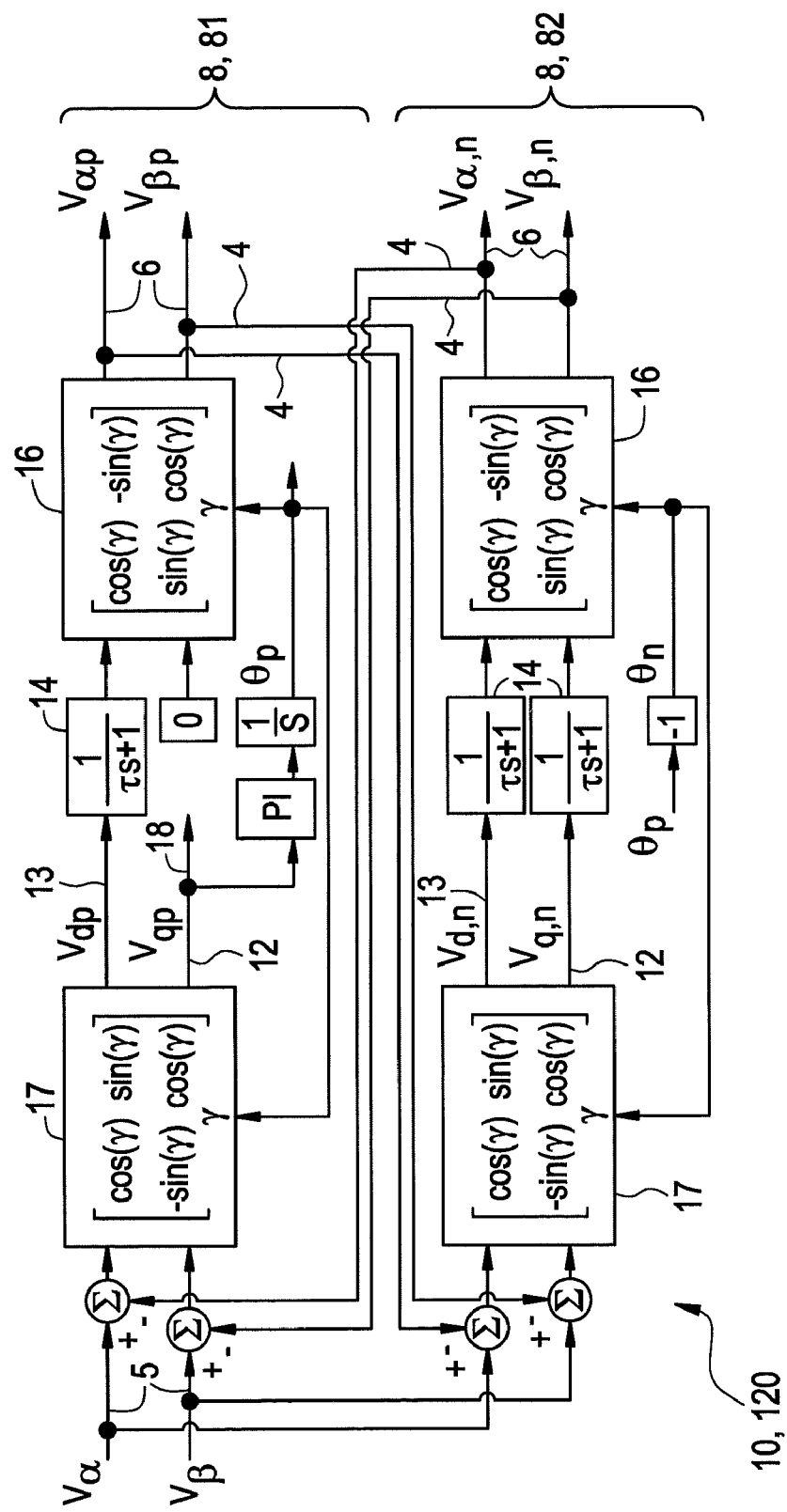
FIG. 3 depicts an embodiment of the CCPLL, referred to as "Option A"

FIG. 3 depicts aspects of an embodiment of a CCPLL 10 structure having a single PLL filter 8, where the q-axis component 12 for the positive sequence is not provided with the low pass filter 14. Note that the phase angle of the input signal 5 filtered by the upper PLL filter 8 is referred to as the positive sequence, as denoted by ($\theta_p$). Likewise, the phase angle of the input signal 5 filtered by the lower PLL filter 8 is referred to as the negative sequence, as denoted by ($\theta_n$). Accordingly, this embodiment includes a positive sequence filter 81, and a negative sequence filter 82. For convenience, this embodiment is referred to herein as Option A 120.

Figure 4:
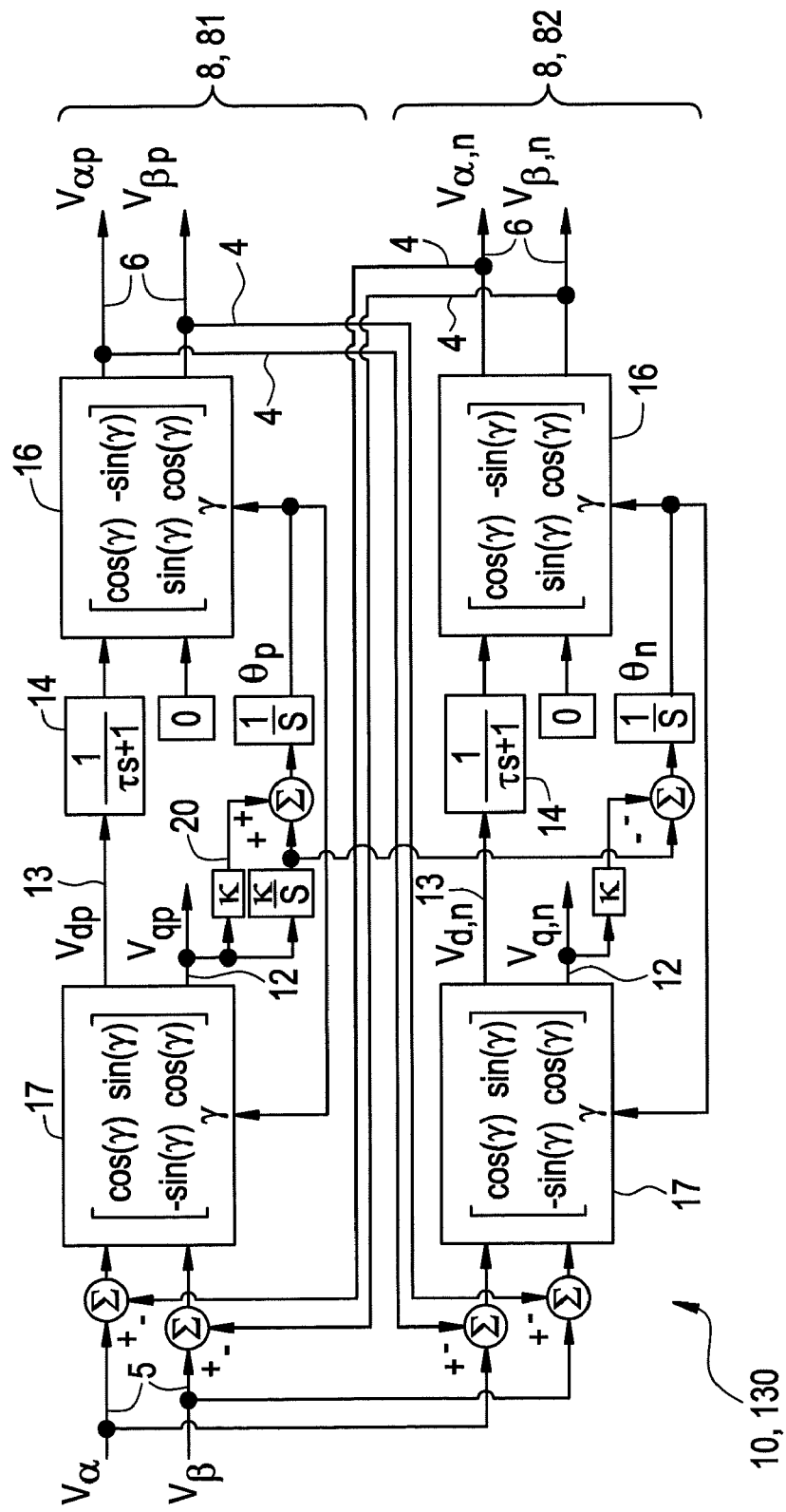
FIG. 4 depicts another embodiment of the CCPLL, referred to as "Option B"

FIG. 4 depicts aspects of another embodiment of a CCPLL 10 structure having two PLL filters 8, each with a single low pass filter 14 for filtering of the d-axis component 13. This embodiment also includes a common integrator 20. In this embodiment, the integrator 20 is included with the positive sequence filter 81. For convenience, this embodiment is referred to herein as Option B 130.

In some embodiments, one of a forward transform phase angle and a reverse transform phase angle of the input signal 5 from the electric grid comprises a common phase angle reference multiplied by a gain parameter.

Figure 5:
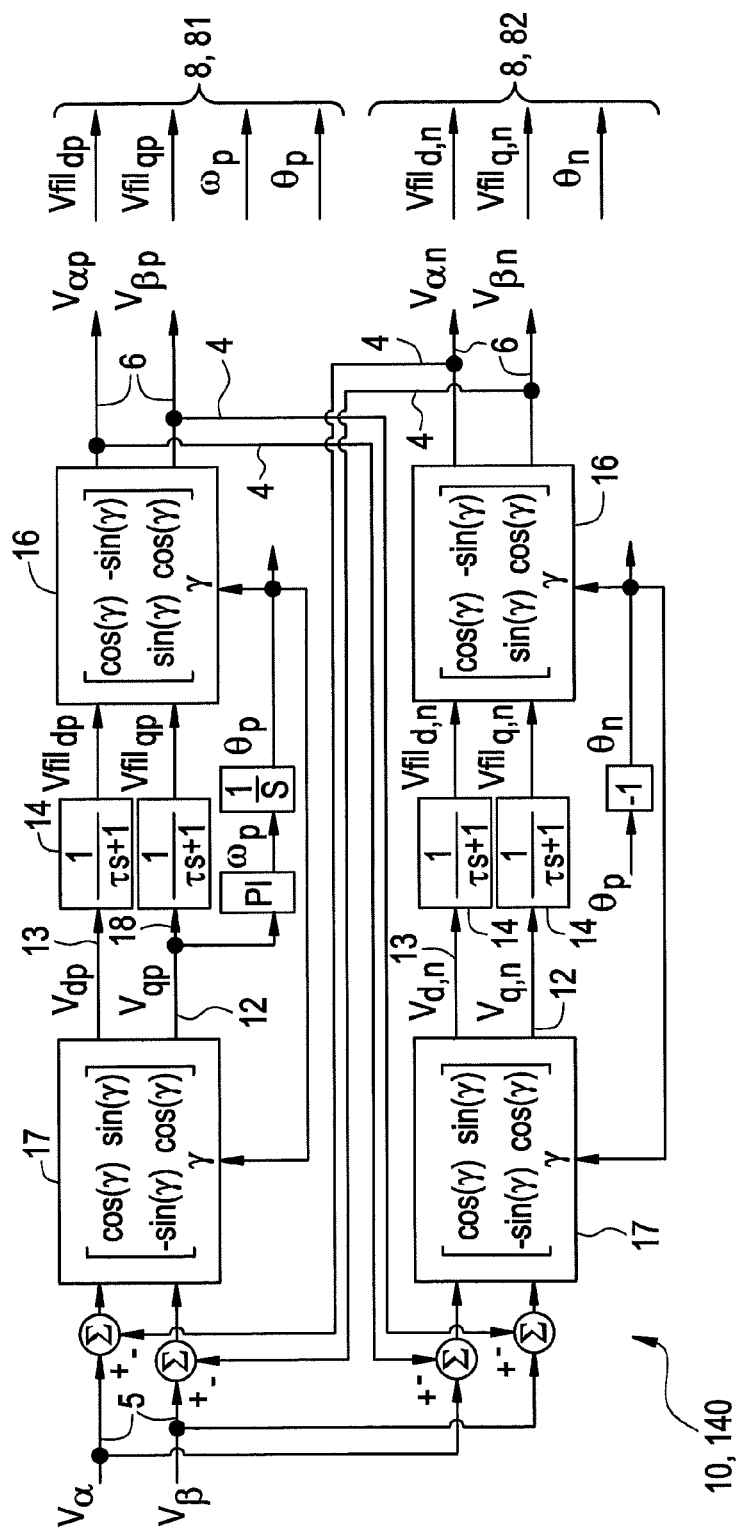
FIG. 5 depicts yet another embodiment of the CCPLL, referred to as "Option C"

FIG. 5 depicts aspects of a further embodiment of a CCPLL 10 structure having the positive sequence filter 81 and the negative sequence filter 82, where the low pass filter 14 is applied on the d-axis component 13 and the q-axis component 12 for each of the PLL filters 8. For convenience, this embodiment is referred to herein as Option C 140.

Figure 6:
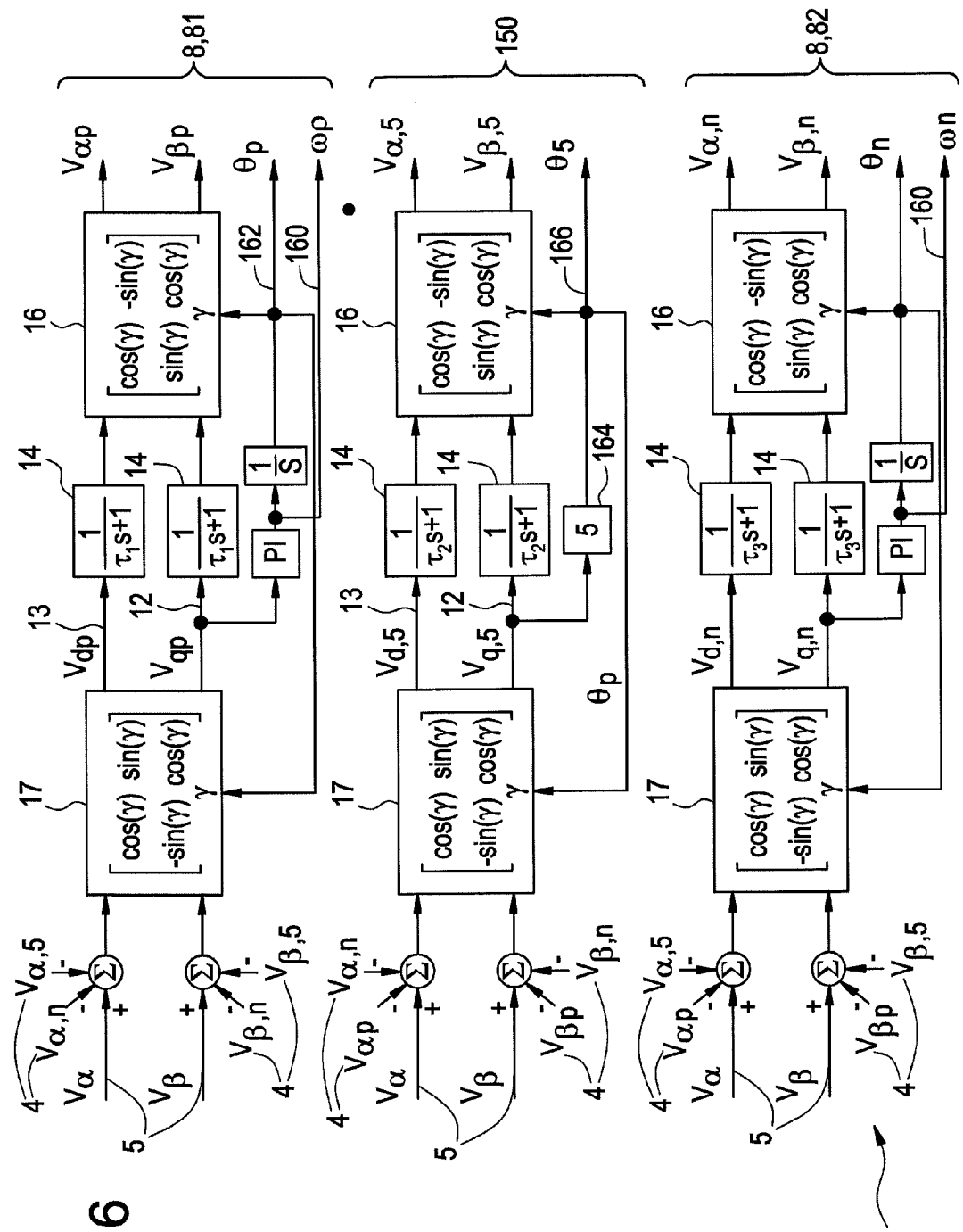
FIG. 6 depicts aspects of an exemplary embodiment of the CCPLL with fifth order harmonic elimination.

Referring to FIG. 6, an exemplary embodiment of the CCPLL 10 where a series of cross coupled harmonic PLL filters 8 are depicted. In this figure, the CCPLL 10 includes a fifth order harmonic filter 150. Exemplary output for the CCPLL 10 with and without the fifth order harmonic filter 150 are depicted in FIG. 7 and FIG. 8, respectively.

Figure 7:
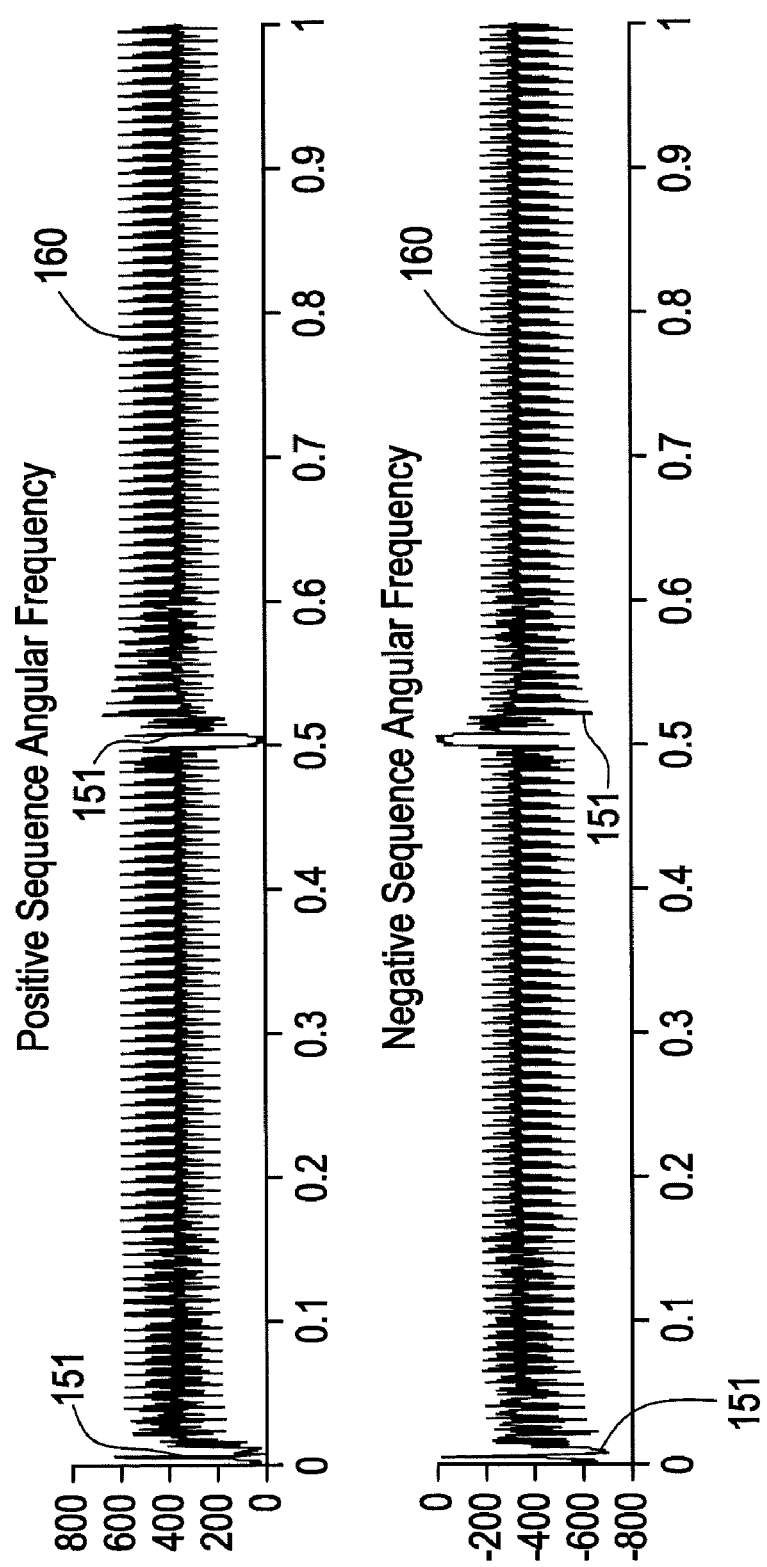
FIG. 7 depicts the output angular frequency from a conventional PLL for input signal that includes two transient events and a fifth order harmonic disturbance.

Referring to FIG. 7, angular frequency output signal 160 of the CCPLL 10 without the fifth order harmonic filter 150 is depicted. The applied input signal 5, generated in a simulation, includes a fundamental frequency (60 Hz) signal with fifth order harmonics. Two transient events 151 may be noted in the angular frequency output signal 160. The first transient event 151 occurring at T=0, the second transient event 151 at T=0.5. The same input signal 5 was used for the CCPLL filter 10 including the fifth order harmonic filter 150 depicted in FIG. 6. The resultant angular frequency output signal 160 is depicted in FIG. 8.

Figure 8:
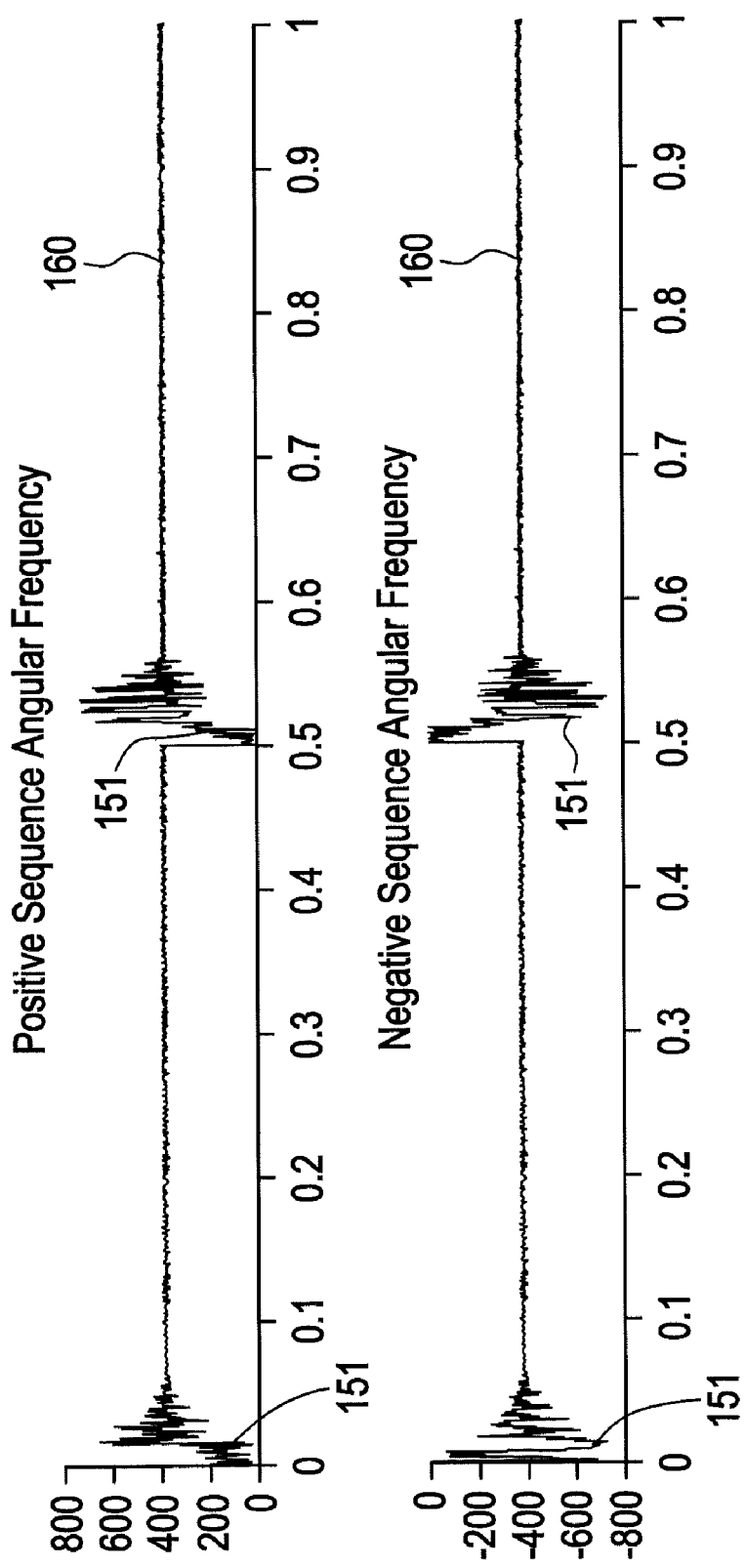
FIG. 8 depicts the output angular frequency from the CCPLL for the input signal of FIG. 7 where the CCPLL depicted in FIG. 6 is used.

Referring to FIG. 8, the effect of use of the fifth order harmonic filter 150 on the angular frequency output signal 160 of the CCPLL filter 10 is readily apparent. That is, the frequency of the angular frequency output signal 160 correctly locks to the fundamental frequency of the input signal 5, and does not display the significant fluctuations of the unfiltered angular frequency output signal 160 depicted in FIG. 7.

Accordingly, the effort required to respond appropriately to transient events is greatly reduced by use of the CCPLL 10. That is, in reference to FIG. 8, one skilled in the art will recognize that the angular frequency output signal 160 of a properly tuned CCPLL 10, as depicted therein, is a type of signal desired for processing and enables a system designer to produce control systems that can provide for rapid response to a transient event 151. Stated another way, the CCPLL 10 may be provided to reduce, substantially reduce, virtually eliminate or eliminate the harmonics or other patterns established in the positive sequence, negative sequence or other aspects of the signal of the electric grid.

As the PLL design of each PLL filter 8 tracks changes in the frequency of the input signal 5, the teachings herein may be applied advantageously to embodiments where frequencies in the input signal 5 change within certain ranges.

Each of the PLL filters 8 is typically designed to provide for marginal attenuation of the various other frequency components arising in the transient event 151.

For cases where the frequency components of the input signal 5 are multiples of each other, such as those typically found in power system harmonics, phase angle information may be multiplied for the use in other PLL filters 8. This approach is applied in the use of the fifth order harmonic filter 150 shown in FIG. 6. In FIG. 6, a positive sequence phase angle 162 is multiplied by a harmonic parameter 164 to establish a fifth harmonic reference angle 166.

One technique to solve the low voltage ride through problem, normally associated with grid transients and faults, involves use of a positive sequence PLL filter 8 cross-coupled to a negative sequence PLL filter 8, which can quickly identify the negative sequence while tracking the positive sequence of the incoming signal. In this way, the amplitude and phase information of the positive or negative sequence component can be made available quickly and accurately to the control system. The control system will then take appropriate actions to reduce transient events 151 and prevent tripping during grid faults.

Figure 9:
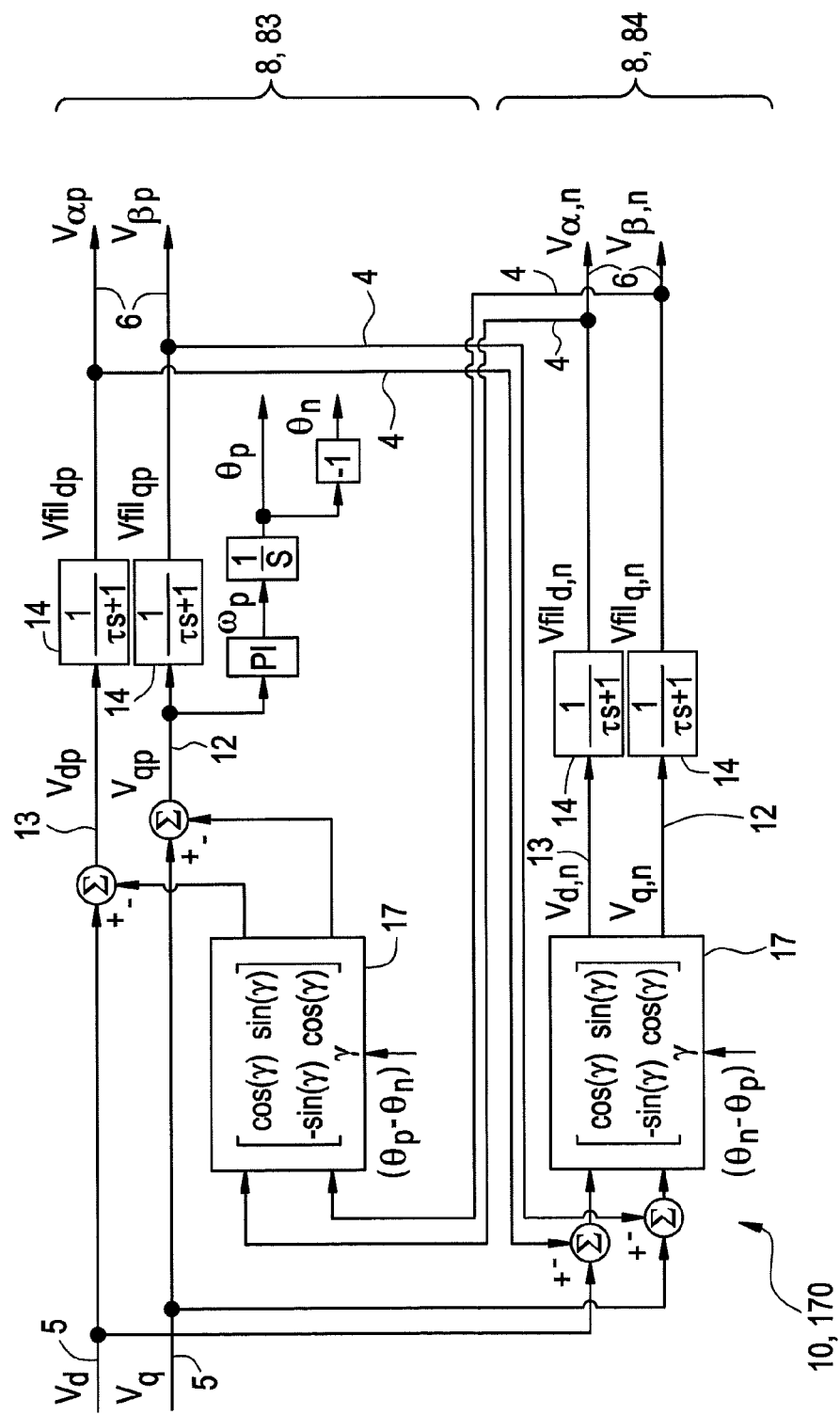
FIG. 9. depicts another embodiment of the CCPLL, referred to as "Option D"; and, FIG. 10 depicts an exemplary embodiment for use of the CCPLL.

FIG. 9 depicts another embodiment of the CCPLL 10 structure, related to the embodiment depicted in FIG. 5. This embodiment receives the input signal 5 in the synchronous reference frame 35. In this embodiment of the CCPLL 10, the cross-coupling circuits 4 include vector transformations based upon frequencies relative to a positive fundamental frequency of the input signal 5. It can be shown through block diagram manipulation that the cross-coupling circuits 4 of FIG. 5 can be incorporated in the synchronous reference frame 35, thus providing for the simplified embodiment of the CCPLL 10 shown in FIG. 9. For convenience, this embodiment is referred to herein as Option D 170. Although the simplified embodiment of FIG. 9 provides a somewhat different configuration than other embodiments depicted herein, for convenience only, aspects of the CCPLL 10 in FIG. 9 are shown as having PLL filters 8 including a modified positive sequence filter 83 and a modified negative sequence filter 84. It should be recognized that this illustration merely depicts additional aspects of design that may be had, and is not limiting of the teachings herein.

Figure 10:
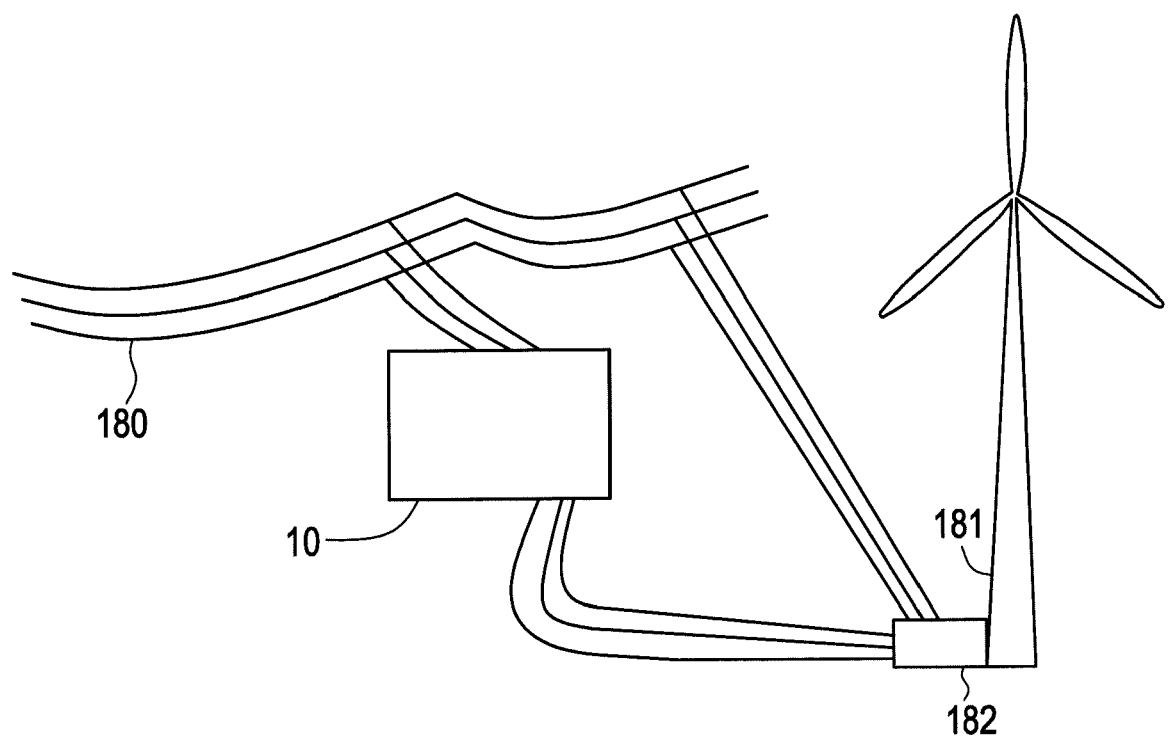

An exemplary embodiment for use of the PLL filter 10 is depicted in FIG. 10. In FIG. 10, an electric generation facility 181 includes a control system 182. The CCPLL 10 is coupled to the control system 182. The electric generation facility 181 (in this example, a wind driven turbine) provides electrical output to the electrical grid 180. In this embodiment, the CCPLL 10 tracks the phase and amplitude information of the sequence components at the point of connection with the grid 180. When a transient event 151 occurs, the improved tracking response enables the control system 182 to take appropriate measures to ensure low voltage ride through (i.e., prevent tripping) by the electric generation facility 181.

While the CCPLL 10 has been described as providing for control input to a wind driven turbine, one skilled in the art will recognize that the CCPLL 10 may be used advantageously to at least one of control and protect various power generation devices and power consuming devices alike. Non-limiting examples of equipment wherein the CCPLL 10 may be used include: a generator converter, a variable speed pump; a fuel cell converter; a variable speed fan; a photovoltaic converter; and variable speed process control equipment.

Therefore, it may be considered that the CCPLL 10 may be used to monitor the signal of the electric grid 180 and to provide, in essence, a control input and protection signal to the control system 182 of equipment coupled to the electric grid 180. That is, the control input and protection signal may be considered as timely notice of an occurrence of the transient event 151. The provision of the timely notice thus providing for adequate measures by the control system 182 to ensure protection and low voltage ride through operation of the equipment.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A cross-coupled phase-lock-loop filter (CCPLL) for tracking an analog power signal of an electric grid, the CCPLL comprising:
a plurality of PLL filters, wherein an input for a first PLL filter in the plurality of PLL filters comprises the analog power signal of the electric grid and an output signal from at least a second PLL filter in the plurality of PLL filters, and wherein the electric grid is connected to an electric generation facility.

2. The CCPLL of claim 1, wherein the analog power signal of the electric grid comprises one of a single-phase signal, a three-phase signal, a multi-phase signal and a poly-phase signal.

3. The CCPLL of claim 1, wherein the first PLL filter in the plurality of PLL filters comprises one of a positive sequence PLL filter and a negative sequence PLL filter.

4. A method for tracking an analog power signal of an electric grid, comprising:
selecting a cross-coupled phase-lock-loop filter (CCPLL) comprising a plurality of PLL filters, wherein an input for a first PLL filter in the plurality of PLL filters comprises the analog power signal of the electric grid and an output signal from at least a second PLL filter in the plurality of PLL filters;
applying the analog power signal of the electric grid to the CCPLL, the CCPLL producing an output signal; and,
monitoring the output signal of the CCPLL to track the analog power signal of the electric grid; wherein the electric grid is connected to an electric generation facility.

5. The method as in claim 4, wherein producing an output signal comprises at least one of substantially extracting from the input analog power signal at least one of a positive sequence frequency and a positive sequence magnitude and a negative sequence frequency and a negative sequence magnitude.

6. The method as in claim 5, wherein producing an output signal comprises substantially removing harmonics from at least one of the positive sequence frequency and the negative sequence frequency in the analog power signal of the electric grid.

7. The method as in claim 4, wherein producing an output signal comprises using a multiple of the fundamental frequency of the input analog power signal for at least one of a forward transform angle and a reverse transform angle.

8. A computer program product stored on machine readable media comprising instructions for tracking an analog power signal of an electric grid, the instructions comprising:
selecting a cross-coupled phase-lock-loop filter (CCPLL) comprising a plurality of PLL filters, wherein an input for a first PLL filter in the plurality of PLL filters comprises the analog power signal of the electric grid and an output signal from at least a second PLL filter in the plurality of PLL filters;
applying the analog power signal of the electric grid to the CCPLL, the CCPLL producing an output signal; and,
monitoring the output signal of the CCPLL to track the analog power signal of the electric grid; wherein the electric grid is connected to an electric generation facility.

9. The computer program product as in claim 8, wherein producing an output signal comprises at least one of substantially extracting from the analog input power signal at least one of a positive sequence frequency and a positive sequence magnitude and a negative sequence frequency and a negative sequence magnitude.

10. The computer program product as in claim 9, wherein producing an output signal comprises substantially removing harmonics from at least one of the positive sequence frequency and the negative sequence frequency in the analog power signal of the electric grid.

11. The computer program product as in claim 8, wherein producing an output signal comprises using a multiple of the fundamental frequency of the analog input power signal for at least one of a forward transform angle and a reverse transform angle.

12. The CCPLL of claim 3, further comprising a fifth order harmonic filter coupled to one of the positive sequence PLL filter and the negative sequence PLL filter.

13. The method as in claim 4, wherein the output signal locks to the fundamental frequency of the electric grid, and does not display fluctuations associated with a transient event.

14. The method as in claim 4, wherein the CCPL reduces, substantially reduces, virtually eliminates or eliminates patterns established in a positive sequence or a negative sequence of the analog power signal for response to a transient event.

* * * * *